United States Patent

Hoenigschmid et al.

Patent Number: 5,970,009
Date of Patent: Oct. 19, 1999

[54] REDUCED STAND BY POWER CONSUMPTION IN A DRAM

[75] Inventors: Heinz Hoenigschmid, Starnberg, Germany; Richard L. Kleinhenz, Wappingers Falls; Jack A. Mandelman, Stormville, both of N.Y.

[73] Assignees: Siemens Aktiengesellschaft, Munich, Germany; International Business Machines Corporation, Armonk, N.Y.

[21] Appl. No.: 09/000,625

[22] Filed: Dec. 30, 1997

[51] Int. Cl.$^6$ ........................................................ G11C 7/00
[52] U.S. Cl. .......................... 365/226; 365/227; 365/229; 365/228
[58] Field of Search ............................ 365/222, 221, 365/229, 226, 227, 228

[56] References Cited

U.S. PATENT DOCUMENTS

| 4,381,552 | 4/1983 | Nocilini et al. | 364/900 |
| 5,262,998 | 11/1993 | Mnich et al. | 365/222 |
| 5,365,487 | 11/1994 | Patel et al. | 365/226 |
| 5,563,839 | 10/1996 | Herdt et al. | 365/227 |
| 5,687,382 | 11/1997 | Kojima et al. | 395/750 |
| 5,703,522 | 12/1997 | Arimoto et al. | 327/534 |
| 5,805,508 | 9/1998 | Tobita | 365/189.09 |

*Primary Examiner*—Viet Q. Nguyen
*Attorney, Agent, or Firm*—Stanton C. Braden

[57] ABSTRACT

Reduced current consumption in a DRAM during standby mode is achieved by switching off the power source that is connected to, for example, the n-well.

18 Claims, 3 Drawing Sheets ent in a DRAM during standby mode. In one embodiment, when the DRAM is detected to be in standby mode, a first power source to the memory array of the DRAM is switched off. The first power source is connected to, for example, n-well of the array. By switching off the power source to the n-well, reduced current consumption is achieved during standby mode.

5,970,009

Figure 3:
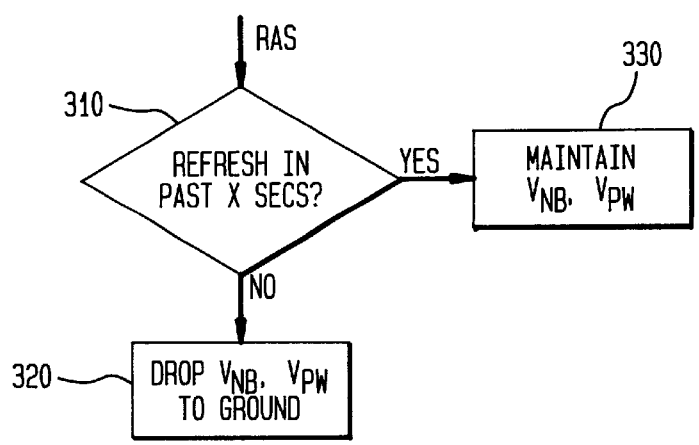
Figure 4:
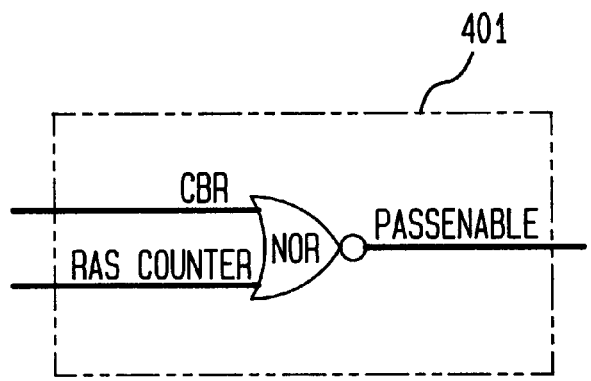

FIG. 3 shows a standby mode of operation in accordance with an embodiment of the invention;

FIG. 4 shows a monitoring circuit for determining standby mode; and

Figure 5:
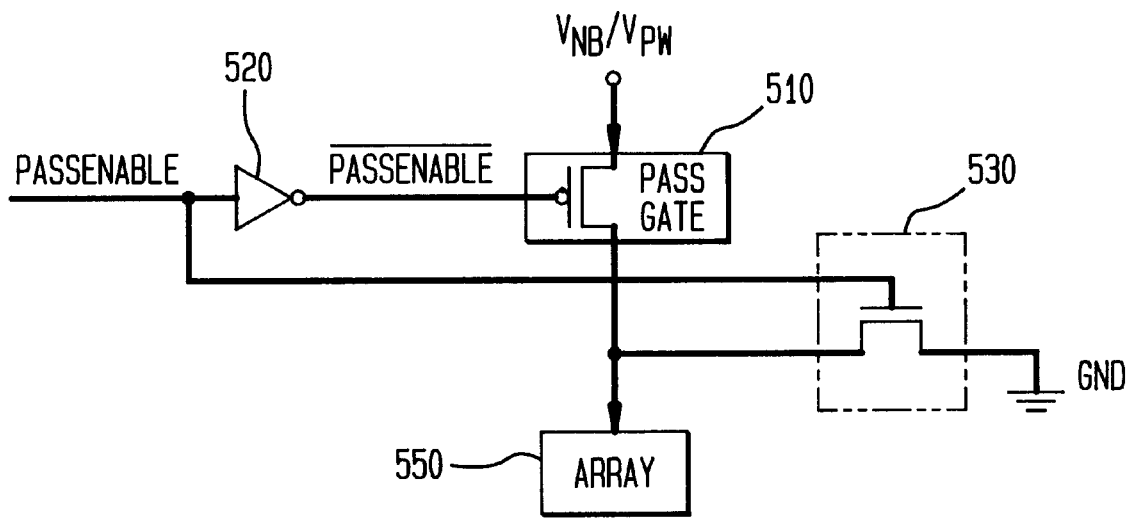

FIG. 5 shows a regulating circuit for controlling the voltages to the array.

DETAIL DESCRIPTION OF THE INVENTION

The invention relates to DRAMs having a standby mode of operation with reduced current consumption. There are various types of standby modes. Some types may require data to be stored in non-volatile memory and to be restored to its pre-standby mode state when resuming normal operation while others do not. In either type, the DRAMs are not refreshed. The invention is described in the context of a DRAM integrated circuit (IC) in which the memory cells employ trench capacitors. To facilitate understanding of the invention, a description of a conventional trench DRAM cell is provided.

Figure 1:
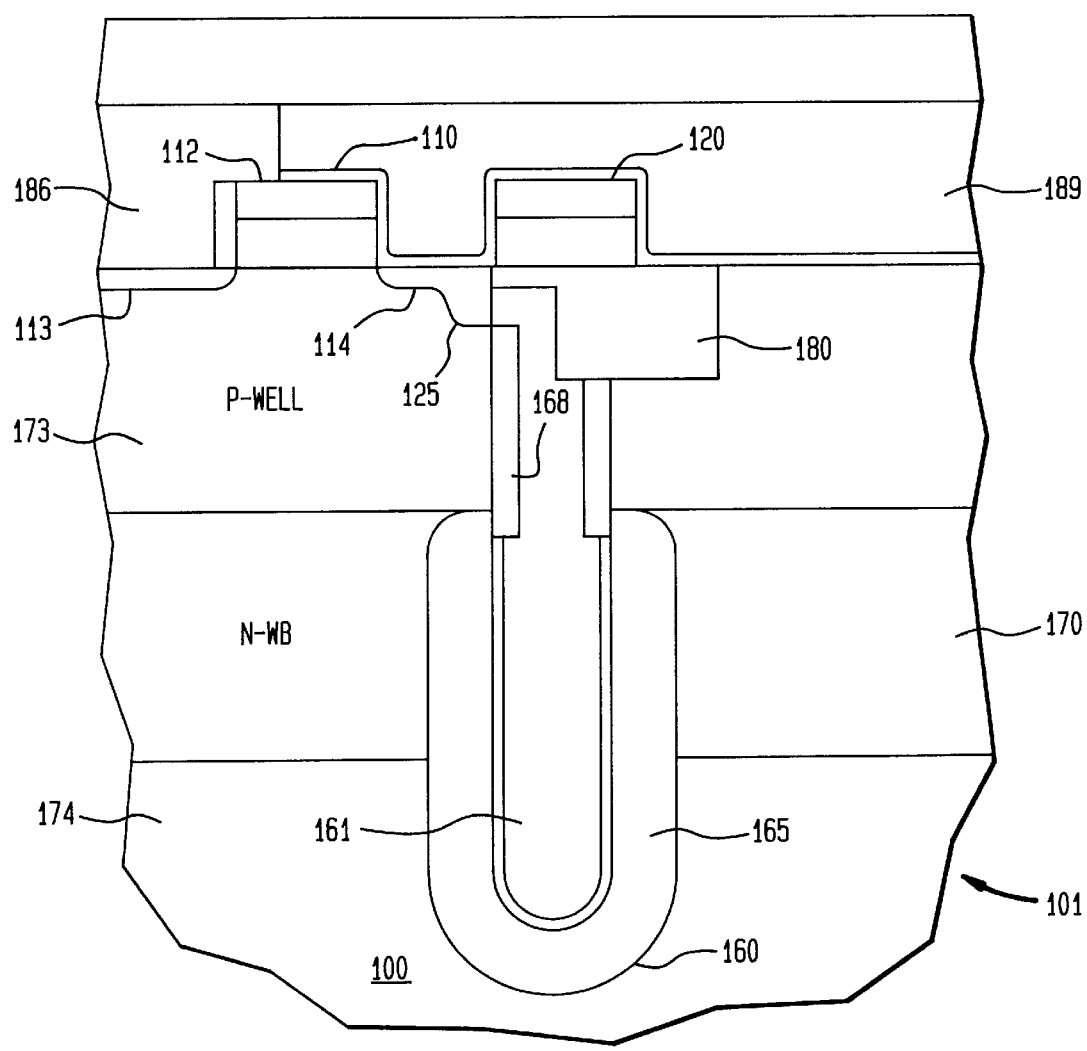
FIG. 1 shows a conventional trench DRAM cell.

Referring to FIG. 1, a conventional trench capacitor DRAM cell 100 is shown. Such conventional trench capacitor DRAM cell is described in, for example, Nesbit et al., *A 0.6 μm² 256Mb Trench DRAM Cell With Self-Aligned Buried Strap (BEST)*, IEDM 93–627, which is herein incorporated by reference for all purposes. Typically, an array of cells are interconnected by wordlines and bitlines to form a DRAM chip.

The DRAM cell 100 comprises a trench capacitor 160 formed in a substrate 101. The substrate is lightly doped with p-type dopants (p⁻), such as boron (B). The trench is filled with, typically, polysilicon (poly) 161 heavily doped with n-dopants (n⁺), such as arsenic (As) or phosphorous (P). The poly, which serves as one plate of the capacitor, is referred to as a "storage node." A buried plate 165 doped with, for example, As is provided in the substrate surrounding the lower portion of the trench. The As is diffused into the silicon substrate from a dopant source. The dopant source may be an As doped silicate glass (ASG) formed on the sidewalls of the trench.

The DRAM cell also comprises a transistor 110. The transistor includes a gate 112, source 113, and drain 114. The gate of the transistor represents a wordline. Since the transistor is connected to the capacitor, it is referred to as an "active wordline." The drain and source are formed by implanting n-type dopants, such as phosphorus (P). Connection of the transistor to the capacitor is achieved via a diffusion region 125. The diffusion region, referred to as the "node diffusion," is formed by out diffusing dopants from the trench poly through a buried strap. The strap is formed by providing As or P dopants outdiffused from the As or P doped poly in the trench.

A collar 168 is formed at an upper portion of the trench. As used herein, the upper portion of the trench refers to the section that includes the collar and the lower portion includes the section below the collar. The collar prevents leakage of the node junction to the buried plate. Leakage is undesirable as it degrades the retention time of the cell. As shown, the collar bounds the bottom of the buried strap and the top of the buried plate.

A buried well 170 comprising n-type dopants, such as P or As, is provided below the surface of the substrate. The peak concentration of dopants in the buried n-well is slightly below the bottom of the collar. The buried well, also referred to as the "n-band," serves to connect the buried plates of the DRAM cells in the array.

A shallow trench isolation (STI) 180 is provided to isolate the DRAM cell from other cells or devices. As shown, a wordline 120, is formed over the trench and isolated therefrom by the STI. Wordline 120 is referred to as the "passing wordline." Such configuration is referred to as a folded bitline architecture.

An interlevel dielectric layer 189 is formed over the wordlines. The interlevel dielectric comprises, for example, doped silicate glass such as borophosphosilicate glass (BPSG). Other doped silicate glass such as phosphosilicate glass (PSG) or borosilicate glass (BSG) is also useful. Alternatively, undoped silicate glass such as TEOS may be used. A conductive layer is formed over the interlevel dielectric layer, forming the bitlines. Bitline contact opening 186 is provided in the interlevel dielectric layer to contact the source 113 to the bitline.

Activation of the transistor by providing the appropriate voltages at the source and gate enables data to be written to or read from the trench capacitor. The source and drain vary between the bitline and node diffusion, depending on whether a read or write is being performed, and the state of the data.

Figure 2:
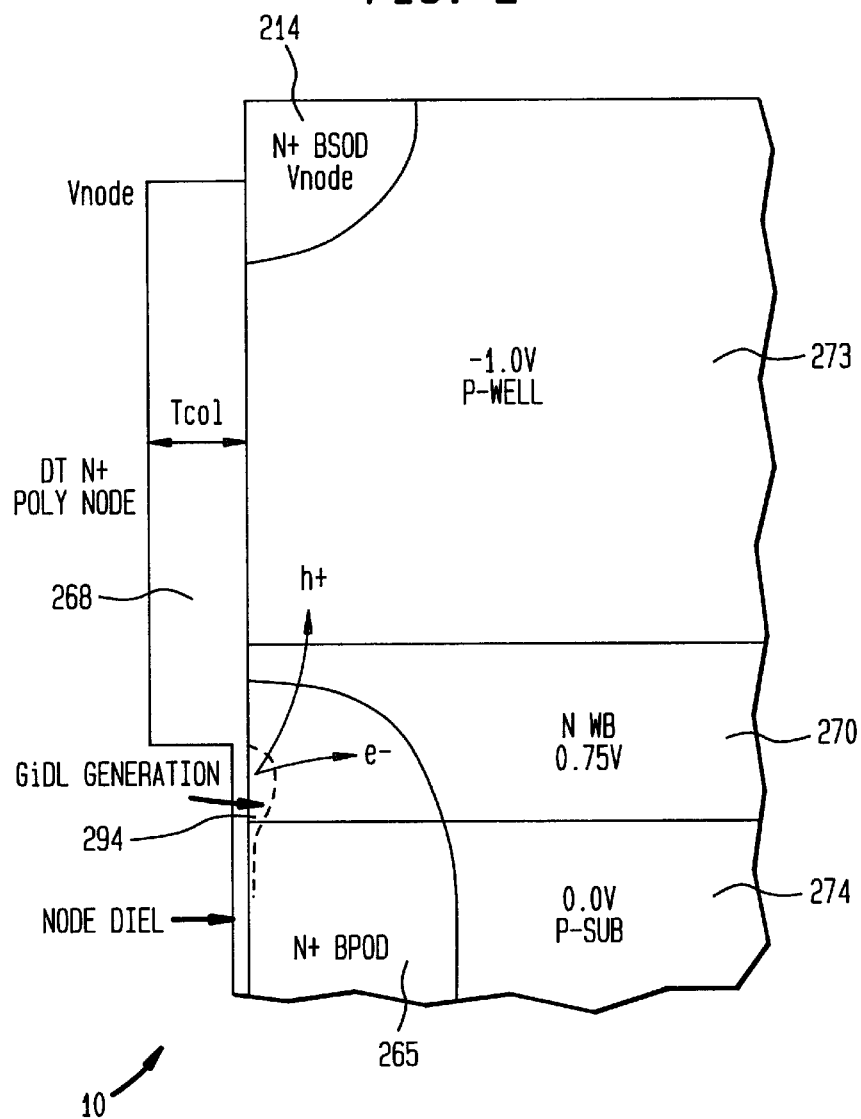
FIG. 2 shows the leakage mechanism during standby mode.

As previously discussed, such DRAM cells exhibit an increase in the flow of leakage current during standby mode. We have discovered that such increase in the flow of leakage current is caused by the large differential between the p-well with respect to the n-well of the DRAM cells FIG. 2 is a sketch of a portion of a trench capacitor DRAM cell illustrating the mechanism that causes leakage during standby mode. As shown, the cell includes a trench capacitor comprising heavily doped n-type dopants therein to form the storage node and to isolate the node diffusion from the buried-plate. A collar 268 is provided in the upper portion of the trench to isolate the p-well from the storage node. Below the p-well is a n-well or n-band region which connects a buried plate 265 of the capacitor with the buried plates of other DRAM cells in the array. Illustratively, the p-well is biased at −1.0 V and the n-well is biased at 0.75 V.

During standby mode when the cells are not refreshed, the doped poly in the trench eventually leaks down to the potential of the p-well, which is about −1.0 V. Since the n-band is biased at about 0.75 V, the potential between the storage node with respect to the n-band is thus about 1.75 V. Such a large differential results in rapid generation of electron-hole pairs in the surface depletion region 291, causing an increase in standby current.

In accordance with one embodiment of the invention, a standby mode of operation with reduced current consumption is provided. The reduction of standby current is achieved by switching off the voltage generator or pump that provides the appropriate voltage to the n-well during standby mode. This reduces the voltage differential between the p-well and n-well. For the above case, switching off the n-band voltage generator decreases the differential from 1.75 to 1.0 V. Such a decrease in voltage differential between the p-well and n-band reduces leakage current. Typically, the leakage current is reduced by 1–2 orders of magnitude, depending on the surface state density. Once normal operating mode is resumed, the n-band generator is switched back on.

In another embodiment, reduction in standby leakage current is achieved by switching off the p-well generator that provides the appropriate voltage to the p-wells. Also, further reduction in standby leakage current can be achieved by switching off both the n-well and p-well generators.

A monitor circuit is provided to detect whether the memory is operating in standby or normal operating mode. If the memory is in standby mode, the n-band voltage pump to the DRAM array is switched off. If the memory is not in standby mode, the n-band voltage pump remains on.

In one embodiment, determination of the mode of operation is achieved by monitoring the refresh activities of the memory. As known in the art, refresh occurs via various techniques. For example, a refresh can be triggered by causing the row address strobe (RAS) signal to be set in its active state (which is active low). Other refresh triggers include an active column address strobe (CAS) signal (which is also active low) before an active RAS or CBR refresh, which places the column address strobe in an active low state before RAS goes to a low active state, and then toggles RAS for the address of each row to be refreshed. These various techniques employ the use of an active RAS signal, alone or in combination with other signals, to trigger the refresh. As such, one embodiment of the invention monitors the RAS signal to determine whether the system is in standby or non-standby mode.

Referring to FIG. 3, a process for operating the memory in accordance to one embodiment of the invention is shown. In step 310, refresh activity is monitored. In one embodiment, the refresh activity is monitored using the RAS signal. If no refresh activity is detected after a predetermined time, the n-band generator to the DRAM array is switched off at step 320. In one embodiment, the predetermined time is $\geq$ about the maximum allowable time between refreshes. In another embodiment, the predetermined time is $\geq$ about the 1.5 times the maximum allowable time between refreshes. If a refresh is detected within the predetermined time, the n-band generator is maintained at its normal operating level at step 330.

Referring to FIG. 4, a monitor circuit 401 is provided in accordance with one embodiment of the invention which detects whether the system is in standby or non-standby mode. Standby or non-standby mode is determined by whether refresh is necessary. If refresh is necessary, the memory is in non-standby mode, and if refresh is not necessary, the memory is in standby mode. In one embodiment, whether refresh is necessary is determined by a CAS before RAS (CBR) signal and a RAS counter (RAScounter) signal. An active RAScounter signal indicates that no refresh activity has occurred within the predetermined time.

As shown in FIG. 4, the monitor circuit 401 comprises a NOR gate which receives the CBR and RAScounter signals as inputs. As shown, the CBR signal is an active high signal and RAScounter is an active low signal. Only an inactive CBR signal and an active RAScounter signal indicate that the memory is in standby mode. In response to an active CBR and inactive RAScounter signals, NOR gate generates an active (high) passenable signal.

The passenable signal is input into a regulating circuit. The regulating circuit controls the voltage generator to the n-well. If the passenable signal is active, the regulating circuit switches off the n-band voltage generator. If, on the other hand, the passenable signal is inactive, the n-band voltage generator is maintained.

FIG. 5 shows an illustrative embodiment of a regulating circuit 501. As shown, the regulating circuit comprises a first switch 510 that controls the n-band generator to the n-well of the memory array 550, and a second switch 530 that controls ground (0 volts) to the n-well of the memory array. The first and second switches comprise, for example, pass transistors. An inverter is connected to the first switch 520. The passenable signal is connected to the input of the inverter and switch 530. An active passenable signal disconnects the n-band generator from the memory array and connects the n-well to ground. An inactive passenable signal connects the n-band generator to the array and disconnects ground from the array.

While the invention has been particularly shown and described with reference to various embodiments, it will be recognized by those skilled in the art that modifications and changes may be made to the present invention without departing from the scope thereof. The scope of the invention should therefore be determined not with reference to the above description but with reference to the appended claims along with their full scope of equivalents.

We claim:

1. A method for reducing standby current in a dynamic random access memory (DRAM) comprising:
   determining whether the DRAM is in standby or normal mode of operation;
   switching off a first power source to an array in the DRAM if the DRAM is in standby mode;
   maintaining the first power source to the array if the DRAM is in a normal mode; and
   outputting from a NOR gate first and second signals for respectively turning the first power source on and off wherein inputs to the NOR gate include a column address strobe before a row address strobe (CBR) signal and a row address strobe counter signal.

2. The method as recited in claim 1, further comprises the step of refreshing the cells of the DRAM after a time interval has elapsed to maintain data stored therein.

3. The method as recited in claim 1, wherein the step of switching off a first power source includes the step of monitoring time intervals between refreshes for the DRAM such that if a predetermined time has elapsed which is greater than or equal to a maximum time limit between refreshes, the first power source is switched off.

4. The method as recited in claim 3, wherein the predetermined time is about 1.5 times the maximum time limit.

5. The method as recited in claim 3, wherein the step of monitoring time intervals includes the step of monitoring a row address strobe (RAS) signal wherein the RAS signal triggers a refresh for the DRAM cells.

6. The method as recited in claim 3, wherein the step of monitoring time intervals includes the step of monitoring a column address strobe (CAS) signal before a row address strobe (RAS) signal (CBR signal) wherein the CBR signal triggers a refresh for the DRAM cells.

7. The method as recited in claim 1, wherein the DRAM includes a first potential driven by the first power source and a second potential driven by a second power source, the first and second potentials cumulatively increasing a potential difference between storage nodes of memory cells in the array and a region external to the storage node, the potential difference driving a leakage current and further comprises the step of switching off the first and second power sources to reduce leakage current in the standby mode.

8. A semiconductor memory having a standby mode and a normal mode comprising:
   a logic circuit for monitoring refresh signals to determine whether the memory is in standby or normal mode of operation;
   a regulating circuit for switching off a first power source and a second power source to an array in the DRAM if the DRAM is in standby mode wherein the first power source and the second power source are maintained to the array if the DRAM is in normal mode, the first source and second power source for causing a cumulative potential difference between a p-well and an n-well adjacent to a trench capacitor in the array.

9. The memory as recited in claim 8, wherein the DRAM includes a first potential driven by the first power source and a second potential driven by the second power source, the first and second potentials cumulatively increasing a potential difference between storage nodes in the array and a region external to the storage node, and the regulating circuit includes transistors for turning off the first and second power sources thereby reducing the potential difference and reducing a leakage current in the standby mode.

10. The memory as recited in claim 8, wherein the regulating circuit includes a first switch for coupling the first power source to the array when turned on by a first signal and a second switch for decoupling the first power source from the array when turned on by a second signal.

11. The memory as recited in claim 10, wherein the first signal and the second signal are digital complements.

12. The memory as recited in claim 11, wherein logic circuit includes a NOR gate wherein inputs to the NOR gate include a column address strobe before a row address strobe (CBR) signal and a row address strobe counter signal and an output of the NOR gate provides the first and second signals.

13. A dynamic random access memory (DRAM) having a standby mode and a normal mode comprising:
   an array of memory cells, each memory cell having a storage node for storing charge;
   a first power source for maintaining a first potential in a first region located externally to the storage node;
   means for determining whether the DRAM is in standby or normal mode of operation; and
   switching means for turning off the first power source to the array in the DRAM if the DRAM is in standby mode in accordance with a first signal and maintaining the first power source to the array if the DRAM is in normal mode in accordance with a second signal such that leakage from the storage node is reduced during the standby mode; and
   the first and second signals being output from a NOR gate wherein inputs to the NOR gate include a column address strobe before a row address strobe (CBR) signal and a row address strobe counter signal.

14. The memory as recited in claim 8, wherein the DRAM includes a second potential driven by a second power source, the first and second potentials cumulatively increasing a potential difference between storage nodes of memory cells in the array and a region external to the storage node, and the switching means includes a logic circuit for turning off the first and second power sources thereby reducing the potential difference and reducing a leakage current in the standby mode.

15. The memory as recited in claim 13, wherein the switching means includes a regulating circuit.

16. The memory as recited in claim 15, wherein the regulating circuit includes a first switch for coupling the first power source to the array when turned on by the first signal and a second switch for coupling the first power source to a ground when turned on by the second signal.

17. The memory as recited in claim 16, wherein the first signal and the second signal are digital complements.

18. A semiconductor memory having a standby mode and a normal mode comprising:
   a logic circuit for monitoring refresh signals to determine whether the memory is in standby or normal mode of operation;
   a regulating circuit for switching off a first power source to an array in the DRAM if the DRAM is in standby mode wherein the first power source is maintained to the array if the DRAM is in normal mode, the regulating circuit includes a first switch for coupling the first power source to the array when turned on by a first signal and a second switch for coupling the first power source to a ground when turned on by a second signal; and a NOR gate included in the logic circuit wherein inputs to the NOR gate include a column address strobe before a row address strobe (CBR) signal and a row address strobe counter signal and an output of the NOR gate provides the first and the second signals.

* * * * *